(12) United States Patent
Yang et al.

(10) Patent No.: US 10,281,501 B2
(45) Date of Patent: May 7, 2019

(54) PEAK CURRENT EVALUATION SYSTEM AND PEAK CURRENT EVALUATION METHOD

(71) Applicant: Taiwan Semiconductor Manufacturing Co., Ltd., Hsinchu (TW)

(72) Inventors: Yu-Tao Yang, Zhubei (TW); Wen-Shen Chou, Zhubei (TW); Yung-Chow Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 80 days.

(21) Appl. No.: 15/628,393

(22) Filed: Jun. 20, 2017

(65) Prior Publication Data

US 2018/0164349 A1   Jun. 14, 2018

Related U.S. Application Data

(60) Provisional application No. 62/432,730, filed on Dec. 12, 2016.

(51) Int. Cl.
*G01R 19/04* (2006.01)
*G01R 31/26* (2014.01)
(Continued)

(52) U.S. Cl.
CPC ......... *G01R 19/04* (2013.01); *G01R 31/2601* (2013.01); *G01R 31/2607* (2013.01); *G01R 31/2841* (2013.01); *G01R 31/2856* (2013.01); *H03J 3/12* (2013.01); *H03L 7/18* (2013.01); *H04L 27/20* (2013.01)

(58) Field of Classification Search
CPC ............ H02M 1/42; H02M 2001/007; H02M 2001/0074; H02M 2001/0077; H02M 3/285; H02M 1/36; H02M 2001/0032; G01R 19/04; G01R 31/2601; G01R 31/2607; G01R 31/2841; G01R 31/2856; H03L 5/00; H03L 7/18; H02P 6/18; H03J 3/12; H04L 27/20
See application file for complete search history.

(56) References Cited

U.S. PATENT DOCUMENTS

| 6,275,018 B1* | 8/2001 | Telefus | H02M 3/156 323/222 |
| 2009/0174931 A1* | 7/2009 | Huber | H01S 3/1106 359/340 |

(Continued)

*Primary Examiner* — Vinh P Nguyen
(74) *Attorney, Agent, or Firm* — McClure, Qualey & Rodack, LLP

(57) ABSTRACT

A peak current evaluation apparatus for an IC is provided. The peak current evaluation apparatus includes a pulse tuner and a testing circuit. The pulse tuner receives a clock signal, adjusts pulse width and duty ratio of the clock signal according to at least one predetermined parameter in order to generate a pulse signal with a stress voltage. The testing circuit is coupled to the pulse tuner. The testing circuit, which includes two input ports, receives the pulse signal at one of the two input ports in order to stress a testing device, measures the resistance value of the testing device, and calculates the peak current of the testing device when the resistance value increases and exceeds a threshold value.

20 Claims, 10 Drawing Sheets

(51) Int. Cl.
*H03L 7/18* (2006.01)
*H03J 3/12* (2006.01)
*H04L 27/20* (2006.01)
*G01R 31/28* (2006.01)

(56) References Cited

U.S. PATENT DOCUMENTS

2012/0154066 A1* 6/2012 Kubota .................... H03B 5/06
  331/116 FE
2017/0126341 A1* 5/2017 Kim ....................... H04H 20/72

\* cited by examiner

PEAK CURRENT EVALUATION SYSTEM AND PEAK CURRENT EVALUATION METHOD

CROSS REFERENCE TO RELATED APPLICATIONS

This application claims the benefit of U.S. Provisional Application No. 62/432,730 filed on Dec. 12, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

In order to form a reliable semiconductor device, it is important to accurately evaluate electro-magnetic (EM) peak current. Therefore, an accurate and reliable peak current evaluation system and method are needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
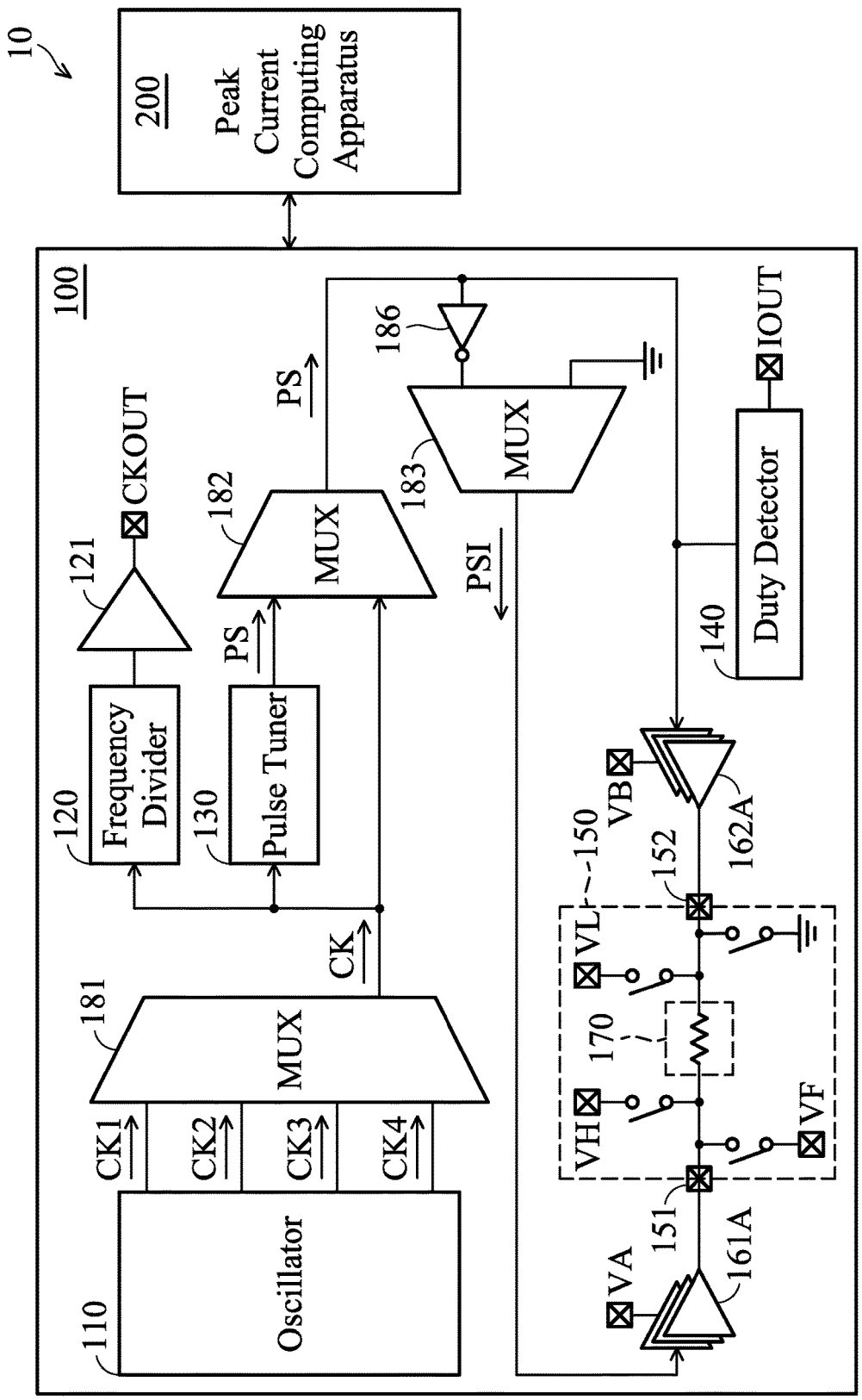
FIG. 1 is a schematic diagram of a peak current evaluation system, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1 is a schematic diagram of a peak current evaluation system 10, in accordance with some embodiments. The peak current evaluation system 10 includes a peak current evaluation apparatus 100 and a peak current computing apparatus 200. As shown in FIG. 1, the peak current evaluation apparatus 100 includes an oscillator 110, a frequency divider 120, a pulse tuner 130, a duty detector 140, a testing circuit 150, at least one buffer 161A and 162A, and at least one multiplexer (MUX) 181-183.

Figure 7:
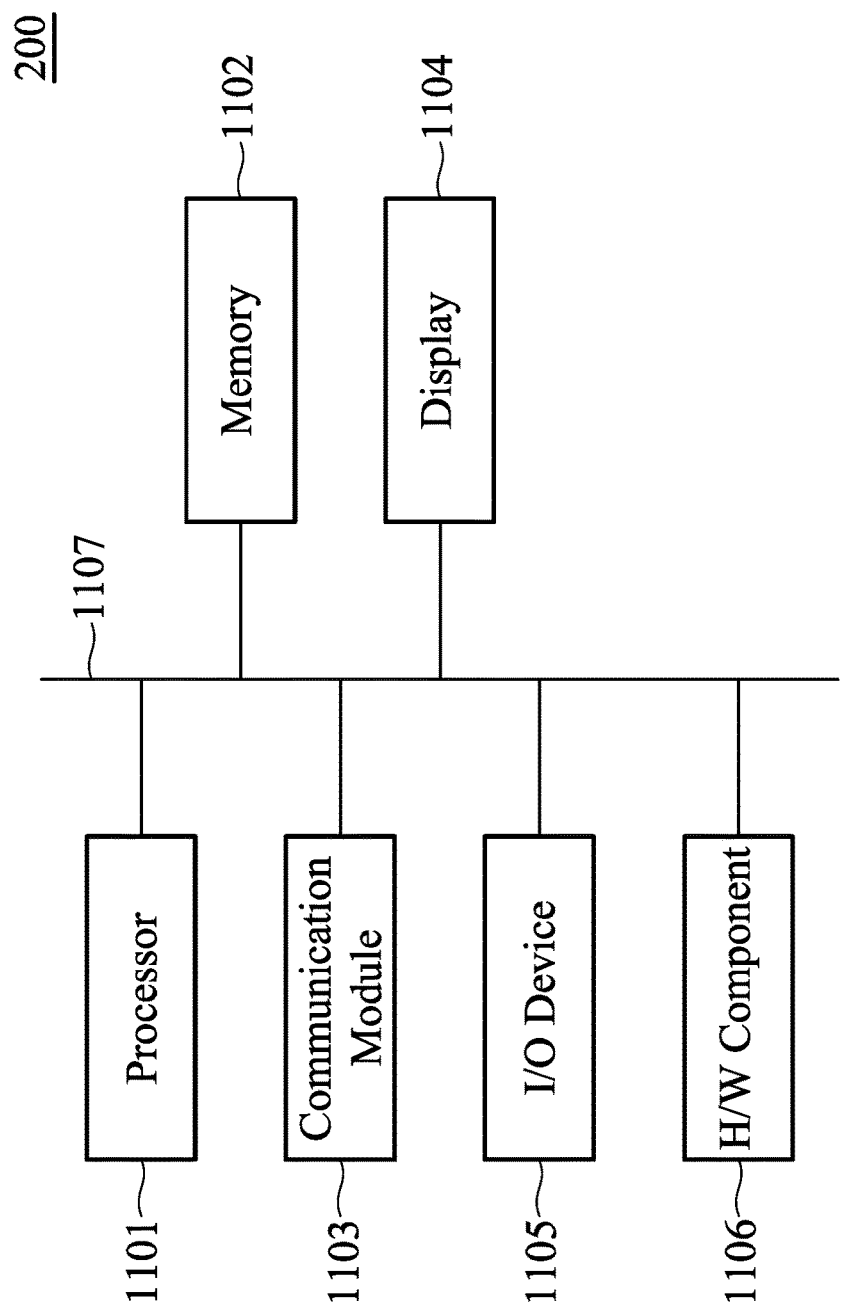
FIG. 7 is a block diagram of a peak current computing apparatus, in accordance with some embodiments.

The peak current computing apparatus 200 includes a processor, which will be further illustrated in FIG. 7. The peak current evaluation apparatus 100 and the peak current computing apparatus 200 could be connected by a probe card, I/O device or other kinds of wires.

The oscillator 110 is utilized to generate at least one clock signal CK1~CK4. Specifically, the oscillator 110 is an on-die voltage-controller oscillator, and it includes a plurality of inverters which can be controlled by voltage. Frequency of the clock signal can be adjusted and controlled by the voltage of the oscillator 110. As shown in FIG. 1, several clock signals Ck1~Ck4 with different frequencies are generated by the oscillator 110.

The MUX 181 is coupled between the oscillator 110 and the pulse tuner 130. The clock signals CJ1~Ck4 are received by the MUX 181 in order to select one clock signal CK from the clock signals CK1~CK4. In the embodiment of FIG. 1, the clock signal CK is transmitted to the frequency divider 120, the pulse tuner 130 and the MUX 182. In other embodiments, the mux 181 is not included in the peak current evaluation apparatus 100. Only one clock signal CK1 is generated by the oscillator 110, and the clock signal CK1 is transmitted to other components of the peak current evaluation system 10 without passing through the mux 181.

The pulse tuner 130 receives the clock signal CK, and adjusts pulse width and duty ratio of the clock signal CK according to at least one predetermined parameter in order to generate a pulse signal PS. The predetermined parameter includes information such as pulse width, duty ratio, frequency, and duration of the pulse signal PS. The predetermined parameter is obtained from IC design data for manufacturing semiconductor devices.

The frequency divider 120 is coupled to the pulse tuner 130 and the oscillator 110, and it is utilized to receive and divide the clock signal CK by a predetermined division value. Afterwards, the divided clock signal is transmitted from the frequency divider 120 to the buffer 121 and the node CKOUT. In other embodiments, the buffer 121 is not included in the peak current evaluation apparatus 100. The clock signal CK can be directly detected through the node CKOUT.

For example, the frequency of the clock signal CK is 8 GHz, and the predetermined division value is 2048. As such, the frequency of the divided clock signal will be around 4 MHz. By sensing or detecting the node CKOUT, the frequency of the clock signal CK can be obtained. It should be noted that the above value of the predetermined division value is mainly for illustration, not used for limiting the present disclosure.

The MUX 182 receives the pulse signal PS and clock signal CK, and selects one from the pulse signal PS and clock signal CK for output. In one embodiment, the pulse signal PS is transmitted from the MUX 182 to the inverter 186 and at least one buffer 162A respectively. In other embodiments, the MUX 182 is not included in the peak current evaluation apparatus 100 because the clock signal CK will not be transmitted to the components other than the frequency divider 120 and the pulse tuner 130. In other words, only the pulse signal PS will be transmitted to the inverter 186, the duty detector 140 and the buffer 162A. Furthermore, in the embodiment, the MUX 183 could also be omitted correspondingly.

The inverter 186 reverses/inverts the pulse signal PS to generate an inverse pulse signal PSI. The polarity of the inverse pulse signal PSI is opposite to the polarity of the pulse signal PS. In some embodiments, the pulse signal PS is transmitted to the testing circuit 150 through the input port 152, and the inverse pulse signal PSI is transmitted to the testing circuit 150 through the input port 151.

In addition, the duty detector 140 is coupled between the pulse tuner 130 and the testing circuit 150 to detect the duty ratio of the pulse signal PS. The MUX 183 is coupled between the inverter 186 and at least one buffer 161A. The testing device 150 is coupled between the buffers 161A and 162A. In other words, the buffers 161A and 162A are arranged in two sides of the testing circuit 150 and are opposite to each other. Therefore, the inverse pulse signal PSI and the pulse signal PS are applied to two sides (two input ports 151 and 152) of the testing circuit 150 through the buffers 161A and 162A respectively. The buffers 161A and 162A include a node VA and a node VB respectively. The nodes VA and/or VB are utilized to receive the stress voltage for stressing the testing device 170 and measuring the peak current Ipeak of the testing device 170, which will be illustrated in FIG. 4A.

The testing circuit 150 is utilized to measure resistance value of the testing device 170, and peak current Ipeak of the testing device 170 is determined when the resistance value increases and exceeds a threshold value. As shown in FIG. 1, the testing circuit 150 includes four switches and two input ports 151 and 152. The four switches connect to the nodes VH, VL, VF and the ground. The testing device 170 is arranged between the two switches connecting the nodes VH and VL.

More specifically, the pulse signal PS is applied to the testing circuit 150 in association with a stress voltage Vstress in order to stress the testing device 150. More specifically, the stress voltage Vstress is utilized to determine the amplitude of signals for stressing the testing device 170. Specifically, the pulse width and duty cycle are determined by the pulse signal PS, and the amplitude is determined by the stress voltage Vstress. The amplitude of the pulse signal PS is equivalent to the stress voltage Vstress. In other words, the amplitude of the pulse signal PS can be controlled by providing the stress voltage Vstress. In some embodiments, the testing device 170 is a metal line. The threshold value is greater than ten times the original resistance value of the metal line. For example, the threshold value could one decade or two decades.

Furthermore, the stress voltage Vstress may be in the range of 0V to 3V. The above range of the stress voltage Vstress is mainly for illustration, not used for limiting the present disclosure. The stress intensity is proportional to the stress voltage Vstress. In other words, the testing device 170 suffers from more stress when the stress voltage Vstress increases. Therefore, when the duty ratio and pulse width of the pulse signal PS are fixed, there is a critical stress voltage Vstress that the testing device cannot endure and that will cause it to melt, which results in an abrupt increase in resistance. The critical stress voltage Vstress, with its corresponding duty ratio and pulse width for the testing device 170, can be determined by incrementally increasing the stress voltage Vstress.

In some embodiments, the resistance value of the testing device 170 is measured based on voltage drop across the testing device 170 and a predetermined current passing through the testing device 170. More specifically, the testing circuit 150 of FIG. 1 could be a four-point Kelvin testing detector in order to evaluate a resistance value of the testing device 170 based on the measured voltage and a predetermined current.

The predetermined current (such as 100 uA) is provided to the testing device 170 through the node VF from the peak current computing apparatus 200 other power supplies which may be arranged inside the on-die peak current evaluation apparatus 100 or outside the die, the voltages of the nodes VH and VL are measured to obtain the voltage drop for measuring the resistance value. Therefore, the resistance value of the testing device 170 can be measured by dividing the voltage drop (voltage difference) of the nodes VH and VL by the predetermined current.

After the testing device 170 is stressed by the pulse signal PS with the stress voltage Vstress, the testing circuit 150 will be utilized to measure the resistance value of the testing device 170. It should be noted that the peak current evaluation system 10 can be manufactured on a wafer. In other words, the peak current evaluation apparatus 100 is on-die.

Therefore, the peak current evaluation apparatus 100 can be easily used for measuring the IC and no other electrical equipment is needed.

Figure 2:
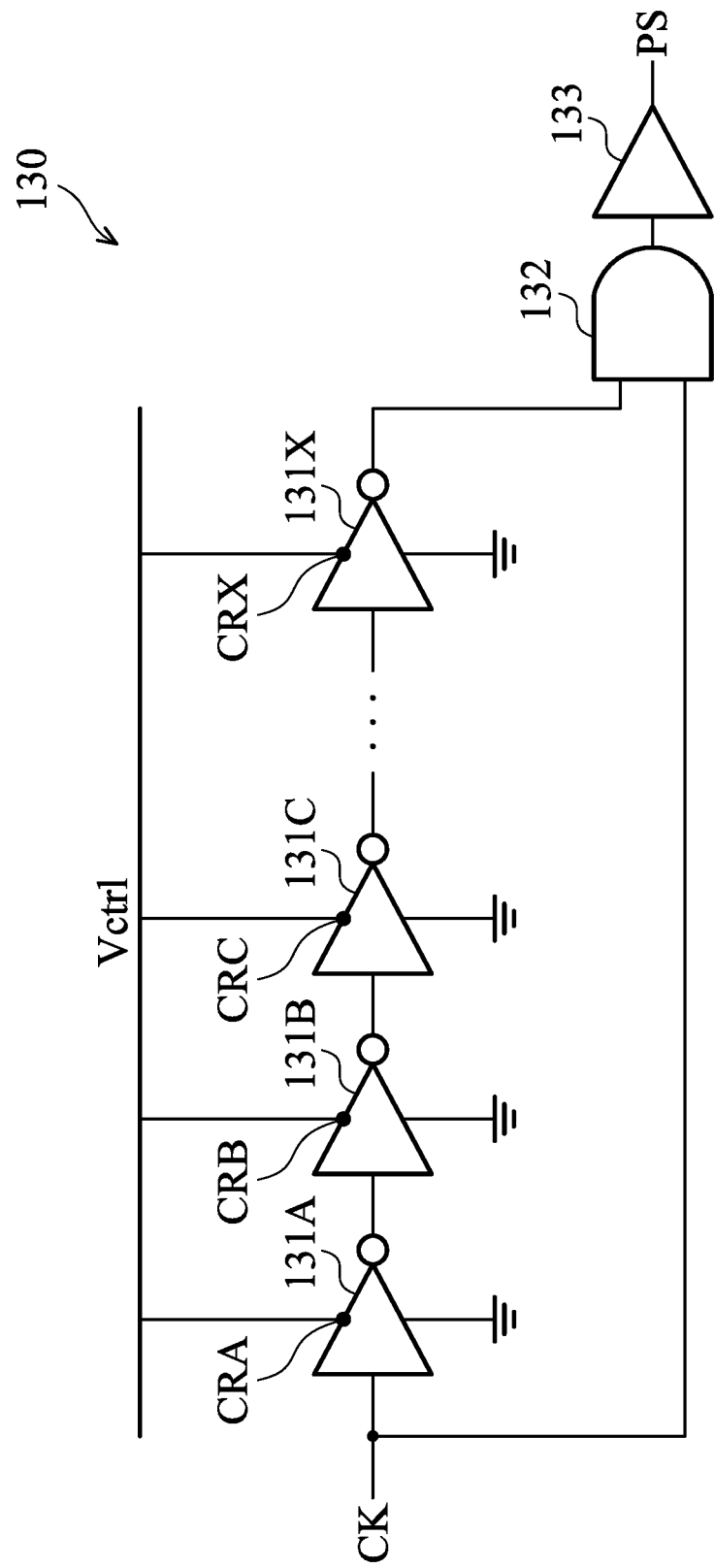
FIG. 2 is a schematic diagram of a pulse tuner in accordance with some embodiments.

FIG. 2 is a schematic diagram of a pulse tuner 130 in accordance with some embodiments. The pulse tuner 130 includes an AND gate 162, a buffer, and a plurality of inverters 131A~131X which are connected in series with each other. Each of the inverters 131A~131X includes a control node. The inverter 131A includes a control node CRA, and the inverter 131B includes a control node CRB. In some embodiment, the control node of the inverters 131A~131X are positive power terminals of the inverters 131A~131X. The pulse tuner 130 receives a clock signal CK, and adjusts pulse width and duty ratio of the clock signal CK according to at least one predetermined parameter in order to generate a pulse signal PS.

In some embodiments, the inverters 131A~131X forms a delay chain to adjust the pulse width and duty ratio of the clock signal CK and generate the pulse signal PS. A control voltage Vctrl is applied to the control nodes CRA~CRX of each of the inverters 131A~131X. The pulse width of the pulse signal PS is inversely proportional to the control voltage Vctrl.

When the control voltage Vctrl decreases, the inverters 131A~131X cause a long delay, and the pulse width and duty ratio of the pulse signal PS will be large. When the control voltage Vctrl increases, the inverters 131A~131X cause a short delay, and the pulse width and duty ratio of the pulse signal PS will be small. In addition, the control voltage Vctrl is determined based on the predetermined parameter of the IC design data.

By utilizing the pulse tuner 130 of FIG. 2, the pulse width and the duty ratio of the pulse signal PS can be adjusted to meet the requirements of the IC design data. Specifically, the pulse width of the pulse signal PS can be modulated by the inverters 131A~131X and the control voltage Vctrl. Accordingly, a variety of pulse widths and duty ratios can be obtained. For example, a pulse width which is smaller than 100 ps (pico-second) can be modulated for the pulse signal PS by the pulse tuner 130. The pulse width of the pulse signal PS is smaller than the usual pulse width of 1ns (nano-seconds). Therefore, the testing and evaluation of the peak current can be accurate and reliable.

Figure 3A:
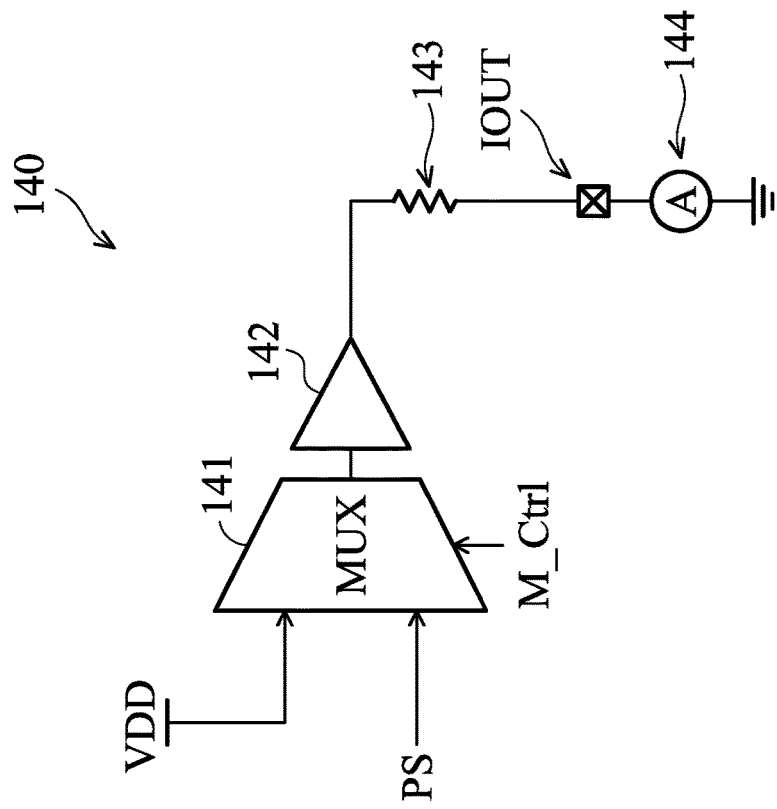
FIG. 3A is a schematic diagram of a duty detector, in accordance with some embodiments.

FIG. 3A is a schematic diagram of a duty detector 140, in accordance with some embodiments. The duty detector 140 includes a MUX 141, a buffer 142, a resistor 143 and a node IOUT. A current detector 144 is coupled to the duty detector 140 through the node IOUT to detect the current passing through the buffer 142 and the resistor 143.

The MUX 141 is utilized to receive the pulse signal PS and to connect the supply voltage VDD which may be arranged inside the on-die peak current evaluation apparatus 100 or outside the die. In some embodiments, the value of the supply voltage VDD is equivalent to the value of the stress voltage Vstress. Specifically, the M_Ctrl signal is transmitted to the MUX 141 to switch the MUX 141 for receiving the pulse signal PS or the supply voltage VDD. The buffer 142 is utilized to amplify and stabilize the current.

Figure 3B:
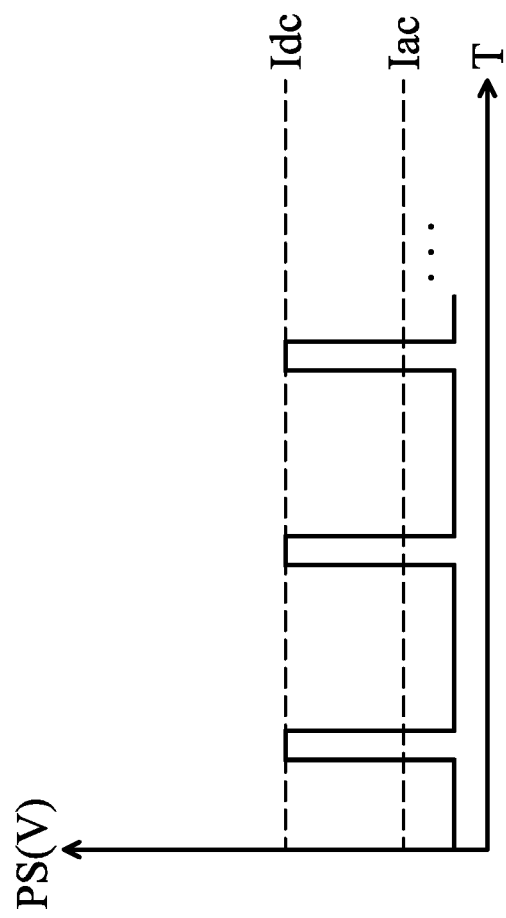
FIG. 3B is a schematic diagram of a pulse signal, in accordance with some embodiments.

In the embodiment of FIG. 3A, the duty detector 140 measures an AC current value of the pulse signal PS and a DC current value, and determines the duty ratio of the pulse signal PS by dividing the AC current value by the DC current value. FIG. 3B is a schematic diagram of a pulse signal PS versus time, in accordance with some embodiments. When the MUX 141 is switched to receive the pulse signal PS, the AC current value Iac can be measured by the current detector 144. When the MUX is switched to the supply voltage VDD, the DC current value Idc can be measured by the current detector 144. Afterwards, the duty ratio of the pulse signal PS can be calculated and determined using the following equation:

$$r(\text{duty ratio}) = \frac{Iac}{Idc}$$

Figure 4A:
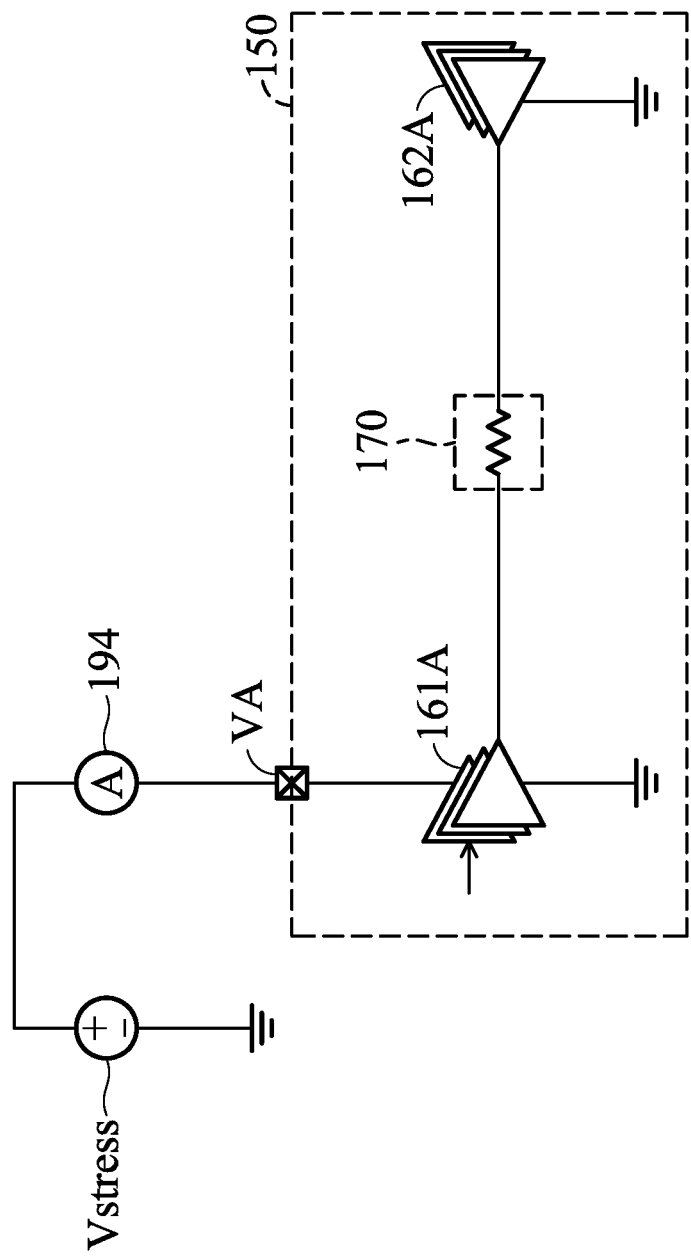
FIG. 4A is a schematic diagram of a testing device, in accordance with some embodiments.

FIG. 4A is a schematic diagram of a testing circuit 150, in accordance with some embodiments. The testing circuit 150 includes a testing device 170 and a plurality of buffers 161A and 162A. The testing circuit 150 connects a stress voltage Vstress and a current detector 194 through the node VA. In this embodiment, the nodes VH, VL and VF are not connected to the testing device 170 for measuring the peak current Ipeak. The stress voltage Vstress may be arranged inside the on-die peak current evaluation apparatus 100 or outside the die.

The stress voltage Vstress is associated with the pulse signal PS and provided to the testing circuit 150 in order to stress the testing device 170. The pulse signal PS is generated by the pulse tuner 130. In addition, the buffers 161A~162A are utilized to amplify and stabilize the stress voltage Vstress so that the current passing through the testing device 170 can be measured by the current detector 194.

Figure 4B:
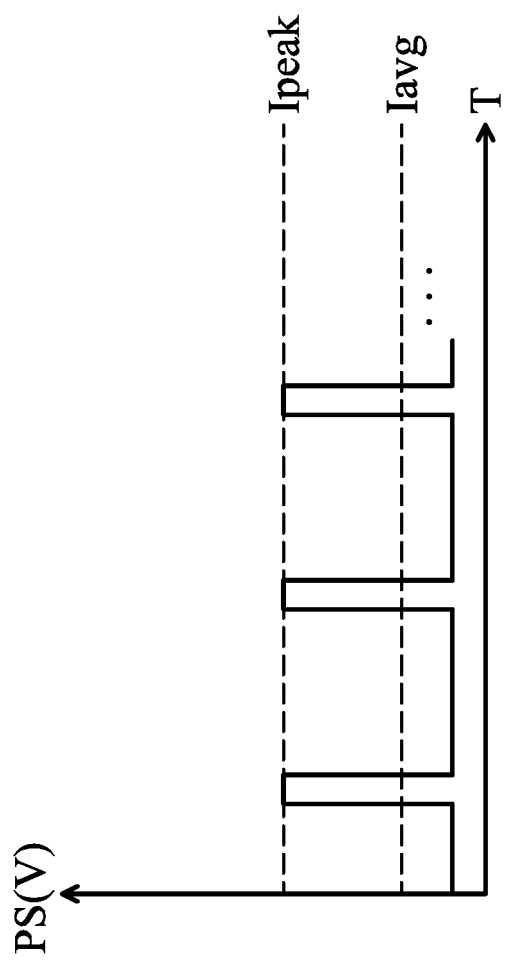
FIG. 4B is a schematic diagram of a pulse signal, in accordance with some embodiments.

In some embodiments, the peak current Ipeak of the testing device 170 is determined by measuring an average current value Iavg of the pulse signal PS with the stress voltage Vstress. The peak current Ipeak is determined by dividing the average current value Iavg by the duty ratio. FIG. 4B is a schematic diagram of a pulse signal PS versus time, in accordance with some embodiments. Specifically, Iavg is the average current value measured by the current detector 194 when the stress voltage Vstress is applied to the testing circuit 150. The peak current Ipeak of the pulse signal PS can be calculated and determined using the following equation:

$$Ipeak = \frac{Iavg}{r(\text{duty ratio})}$$

Figure 5A:
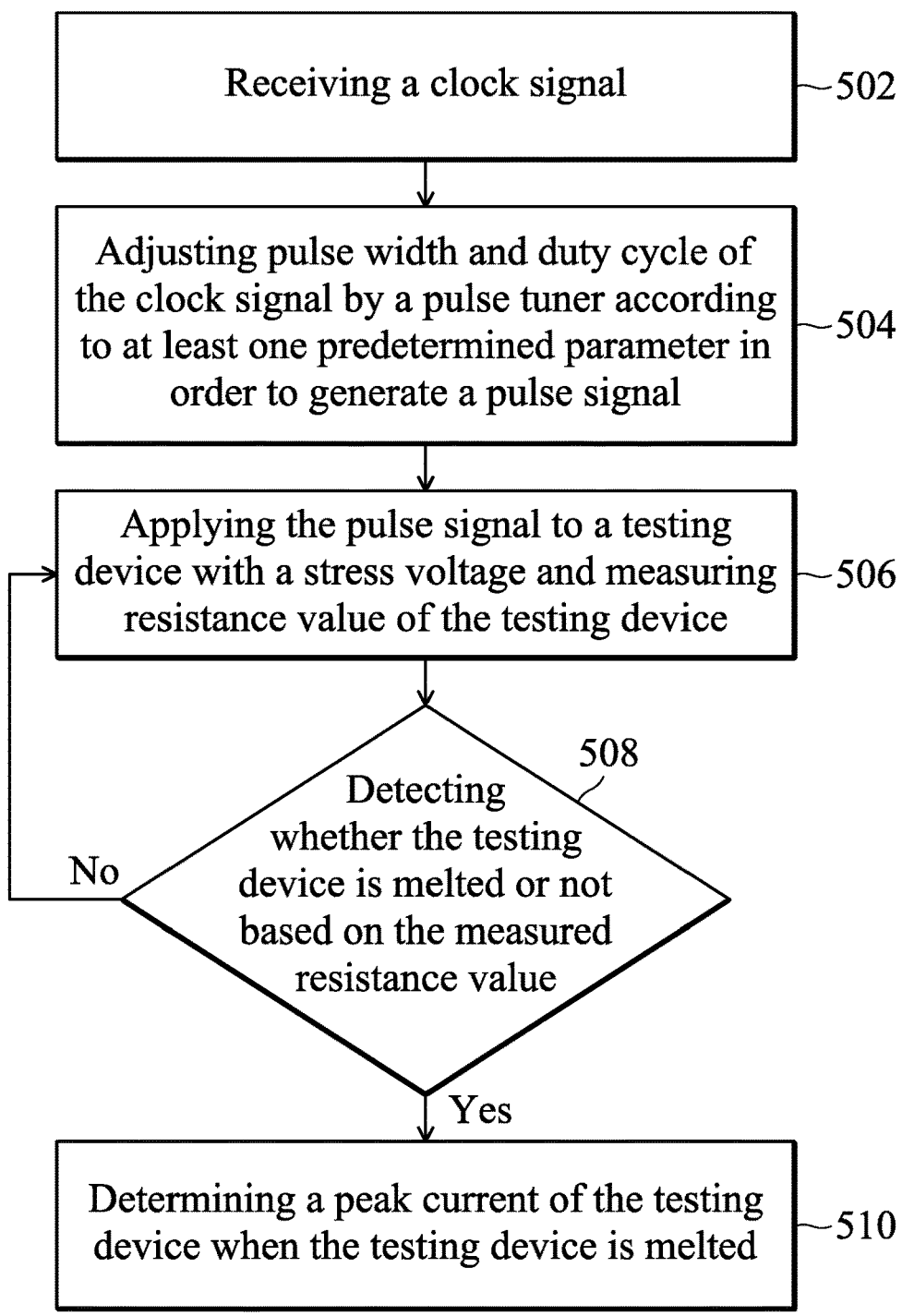
FIG. 5A is a flow chart of a method for evaluating the peak current, in accordance with some embodiments.

FIG. 5A is a flow chart of a method 500 for evaluating the peak current Ipeak, in accordance with some embodiments. The method 500 may be implemented, in whole or in part, by the peak current computing apparatus 200. It should be understood that additional operations can be provided before, during, and after the method 500, and some operations described can be replaced, eliminated, or moved around for additional embodiments of the method. The method 500 is an example, and is not intended to limit the present disclosure beyond what is explicitly recited in the claims. The method 500 includes operations 502 to 510. These operations are discussed further below.

In operation 502, the clock signal CS is received by the pulse tuner 130. In operation 504, the pulse tuner 130 adjusts pulse width and duty ratio of the clock signal CS according to at least one predetermined parameter in order to generate the pulse signal PS. The predetermined parameter includes information such as pulse width, duty ratio, frequency, and duration of the pulse signal PS, and the predetermined parameter is obtained from IC design data.

In operation 506, the pulse signal PS is applied to a testing device 170 with a stress voltage Vstress, and resistance value of the testing device 170 is measured by the testing circuit 150. In operation 508, whether the testing device 170 has melted or not is detected based on the measured resistance value.

When the testing device 170 has not melted, operation 506 will be executed with another stress voltage which is greater than the previous stress voltage in order to provide a severer stress for the testing device 170. When the testing device 170 has melted, operation 510 is executed to determine the peak current Ipeak of the testing device 170. The details of determining the peak current Ipeak have been illustrated, and are not repeated.

Figure 5B:
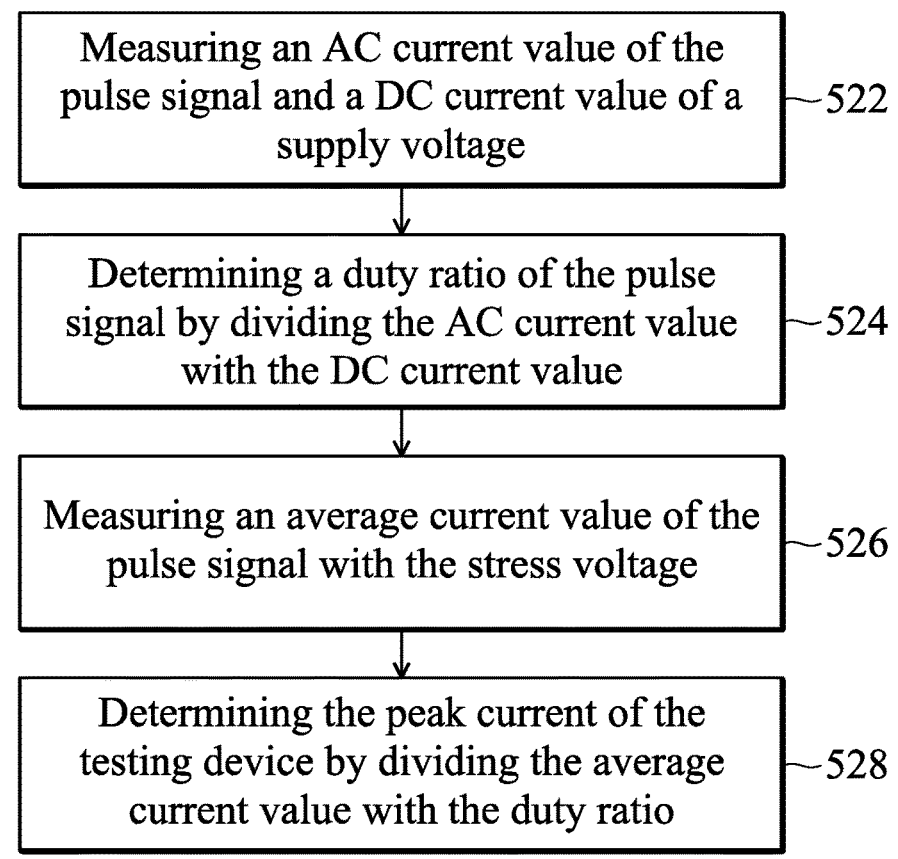
FIG. 5B is a flow chart of another method for evaluating the peak current, in accordance with some embodiments.

FIG. 5B is a flow chart of another method 520 for evaluating the peak current Ipeak, in accordance with some embodiments. The method 520 illustrates how to determine the peak current Ipeak of the testing device 170 when the testing device 170 has melted. In operation 522, the AC current value of the pulse signal PS and the DC current value of the supply voltage are measured. In operation 524, the duty ratio of the pulse signal PS is determined by dividing the AC current value by the DC current value. In operation 526, the average current value of the pulse signal PS with the stress voltage Vstress is measured. In operation 528, the peak current Ipeak of the testing device 170 is calculated by dividing the average current value by the duty ratio.

Figure 6:
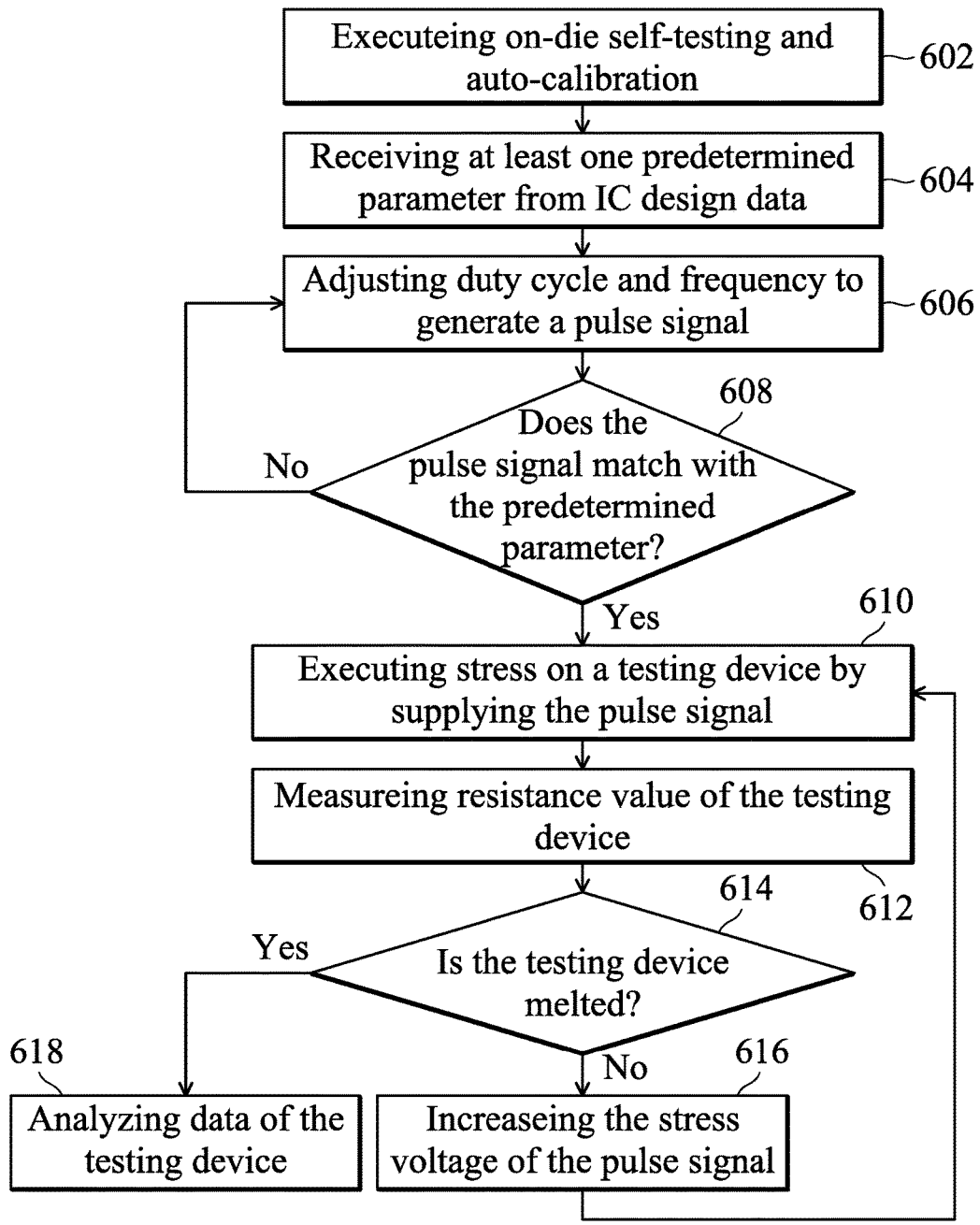
FIG. 6 is a flow chart of another method for evaluating the peak current, in accordance with some embodiments.

FIG. 6 is a flow chart of another method 600 for evaluating the peak current Ipeak of the testing device 170, in accordance with some embodiments. The method 600 includes operations 602 to 618. The operations 602 to 608 belong to the self-setting phase, and operations 610 to 618 belong to the stress and measurement phase. It should be understood that additional operations can be provided before, during, and after the method 600, and some operations described can be replaced, eliminated, or moved around for additional embodiments of the method.

In operation 602, on-die self-testing and auto-calibration are executed by the peak current evaluation system 10. In operation 604, at least one predetermined parameter is received from IC design data. In operation 606, duty ratio and frequency are adjusted by the pulse tuner 130 to generate a pulse signal PS. In operation 608, whether or not the pulse signal PS match the predetermined parameter is determined.

When the pulse signal PS does not match the predetermined parameter, operation 606 will be executed again by the pulse tuner 130 in order to match the predetermined parameter. When the pulse signal PS matches the predetermined parameter, operation 610 will be executed to provide stress for a testing device 170 by supplying the pulse signal PS. In operation 612, the resistance value of the testing device 170 is measured by the testing circuit 150.

In operation 614, whether the testing device 170 has melted or not is determined. When the testing device 170 has not melted, the stress voltage Vstress of the pulse signal PS is increased, and operation 610 will be executed again to perform another stress with the increased stress voltage Vstress. When the testing device 170 has melted, operation 618 is executed to analyze the data of the testing device 170. The data may include the peak current Ipeak, the stress voltage Vstress, pulse width, duty ratio, frequency, and duration of the pulse signal PS.

FIG. 7 is a block diagram of a peak current computing apparatus 200, in accordance with some embodiments. One or more of the tools and methods and operations described with respect to FIGS. 5-6 are realized in some embodiments by the peak current computing apparatus 200 of FIG. 7. The peak current computing apparatus 200 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 may include a digital signal processor (DSP), a microcontroller (MCU), a central-processing unit (CPU) or a plurality of parallel processors relating the parallel processing environment to implement the operating system (OS), firmware, driver and/or other applications of the peak current evaluation system 10.

Specifically, the processor 1101 is utilized to execute the peak current method of FIGS. 5-6. For example, the processor 1101 can be utilized to detect whether the testing device 170 has melted or not based on the measured resistance value, and determining the peak current of the testing device 170 when the testing device 170 has melted.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions by the processor 1101.

In some embodiments, the memory 1102 can be used to record IC data and the predetermined parameter obtained from IC design data. The predetermined parameter includes information such as pulse width, duty ratio, frequency, and duration of the pulse signal. In addition, the determined peak current in association with its corresponding predetermined parameter could also be recorded in the memory 1102.

The communication module 1103 is operable to communicate information such as IC design layout files with the other components in the IC manufacturing system 100, such as design house 102. Examples of communication modules may include Ethernet cards, 802.11 WiFi devices, cellular data radios, and/or other suitable devices known in the art.

The display 1104 is utilized to display the processing data and processing parameters of the IC 130. The display 1104 can be a liquid-crystal panel or a touch display panel. The I/O device 1105 includes an input device, an output device and/or a combined input/output device for enabling user interaction with the peak current evaluation apparatus 100. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to the user.

In some embodiments, one or more of the operations and/or functions of the tools and/or systems described with respect to FIGS. 1-6 is/are implemented by specially configured hardware (e.g., by one or more application-specific integrated circuits or ASIC(s)) which is/are included) separate from or in lieu of the processor 1101. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By utilizing the proposed peak current evaluation system, peak electro-magnetic (EM) current can be measured and calculated accurately. The peak current is usually measured and evaluated by applying the pulse signal PS to the testing device 170. The pulse width and the duty ratio of the pulse signal PS can be adjusted and modulated by the proposed pulse tuner 130. Therefore, a short pulse duration such as 100 ps can be derived. In addition, the pulse signal PS can be provided in bi-direction by the peak current evaluation apparatus 100. Therefore, an accurate and reliable peak current evaluation system and method are provided by the present disclosure.

In accordance with some embodiments, a peak current evaluation system for fabricating an IC is provided. The peak current evaluation system includes a peak current evaluation apparatus and a peak current computing apparatus. The peak current evaluation apparatus includes a pulse tuner, a testing circuit and a processor. The pulse tuner receives a clock signal, adjusts pulse width and duty ratio of the clock signal according to at least one predetermined parameter in order to generate a pulse signal. Amplitude of the pulse signal is equivalent to a stress voltage. The testing circuit is coupled to the pulse tuner, supplies the pulse signal to a testing device, and measures resistance value of a testing device. The processor detects whether the testing device has melted or not based on the measured resistance value. The peak current of the testing device is calculated when the testing device has melted.

In accordance with some embodiments, a peak current evaluation apparatus for fabricating an IC is provided. The peak current evaluation apparatus includes a pulse tuner and a testing circuit. The pulse tuner receives a clock signal, adjusts pulse width and duty ratio of the clock signal according to at least one predetermined parameter in order to generate a pulse signal with a stress voltage. The testing circuit is coupled to the pulse tuner. The testing circuit includes two input ports and receives the pulse signal at one of the two input ports in order to stress a testing device. The testing circuit measures the resistance value of the testing device and calculates the peak current of the testing device when the resistance value increases and exceeds a threshold value.

In accordance with some embodiments, a peak current evaluation method for fabricating an IC is provided. The peak current evaluation method includes receiving a clock signal; adjusting pulse width and duty ratio of the clock signal using a pulse tuner according to at least one predetermined parameter in order to generate a pulse signal with a stress voltage; applying the pulse signal to a testing device and measuring resistance value of the testing device; detecting whether the testing device has melted or not based on the measured resistance value; and determining the peak current of the testing device when the testing device has melted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A peak current evaluation apparatus, comprising:
    a pulse tuner, receiving a clock signal, and adjusting pulse width and duty ratio of the clock signal according to at least one predetermined parameter in order to generate a pulse signal with a stress voltage, wherein amplitude of the pulse signal is equivalent to the stress voltage; and
    a testing circuit, coupled to the pulse tuner, comprising two input ports and receiving the pulse signal at one of the two input ports in order to stress a testing device, wherein a resistance value of the testing device is measured based on voltage drop across the testing device and a predetermined current passing through the testing device after stressing the testing device, and a peak current of the testing device is calculated when the resistance value of the testing device increases and exceeds a threshold value.

2. The peak current evaluation apparatus as claimed in claim 1, further comprising:
    an oscillator, coupled to the pulse tuner, utilized to generate the clock signal; and
    a frequency divider, coupled to the pulse tuner and the oscillator, utilized to receive and divide the clock signal by a predetermined division value.

3. The peak current evaluation apparatus as claimed in claim 1, further comprising:
    a duty detector, coupled between the pulse tuner and the testing circuit, utilized to measure an AC current value of the pulse signal and a DC current value of a supply voltage, and determine a duty ratio of the pulse signal by dividing the AC current value by the DC current value, wherein the peak current of the testing device is determined by measuring an average current value of the pulse signal with the stress voltage and dividing the average current value by the duty ratio.

4. The peak current evaluation apparatus as claimed in claim 1, further comprising:
    an inverter, coupled between the pulse tuner and the testing circuit, utilized to reverse the pulse signal to generate an inverse pulse signal whose polarity is opposite to a polarity of the pulse signal, wherein the inverse pulse signal is transmitted to another one of the two input ports.

5. The peak current evaluation apparatus as claimed in claim 4, wherein the pulse tuner comprises a plurality of inverters which are connected in series, a control voltage is applied to the control node of each of the inverters, and the pulse width of the pulse signal is inversely proportional to the control voltage.

6. The peak current evaluation apparatus as claimed in claim 1, wherein the testing device is a metal line, and the threshold value is greater than ten times the original resistance value of the metal line.

7. A peak current evaluation system, comprising:
    a peak current evaluation apparatus, comprising:
        a pulse tuner, receiving a clock signal, adjusting pulse width and duty ratio of the clock signal according to at least one predetermined parameter in order to generate a pulse signal, wherein amplitude of the pulse signal is equivalent to a stress voltage; and
        a testing circuit, coupled to the pulse tuner, supplying the pulse signal to a testing device in order to measure resistance value of the testing device; and a peak current computing apparatus, measuring resistance value of the testing device based on voltage drop across the testing device and a predetermined current passing through the testing device after supplying the pulse signal to the testing device, detecting whether the testing device has melted or not based on the measured resistance value, and calculating a peak current of the testing device when the testing device has melted.

8. The peak current evaluation system as claimed in claim 7, wherein the pulse tuner comprises a plurality of inverters which are connected in series, and a control voltage is applied to a control node of each of the inverters.

9. The peak current evaluation system as claimed in claim 8, wherein the pulse width of the pulse signal is inversely proportional to the control voltage.

10. The peak current evaluation system as claimed in claim 8, wherein the testing circuit is a four-point testing detector, the resistance value of the testing device is measured by dividing the voltage drop by the predetermined current.

11. The peak current evaluation system as claimed in claim 7, wherein the testing device is determined to be melted when the resistance value increases and exceeds a threshold value.

12. The peak current evaluation system as claimed in claim 11, wherein the testing device is a metal line, and the threshold value is greater than ten times an original resistance value of the metal line.

13. The peak current evaluation system as claimed in claim 8, wherein the predetermined parameter comprises information of pulse width, duty ratio, frequency, and duration of the pulse signal, and the predetermined parameter is obtained from IC design data.

14. The peak current evaluation system as claimed in claim 8, further comprising:
a duty detector, coupled between the pulse tuner and the testing circuit, utilized to measure an AC current value of the pulse signal and a DC current value of a supply voltage, and determine a duty ratio of the pulse signal by dividing the AC current value by the DC current value.

15. The peak current evaluation system as claimed in claim 14, wherein the peak current of the testing device is determined by measuring an average current value of the pulse signal with the stress voltage and dividing the average current value by the duty ratio.

16. A peak current evaluation method, comprising:
receiving a clock signal;
adjusting pulse width and duty ratio of the clock signal using a pulse tuner according to at least one predetermined parameter in order to generate a pulse signal with a stress voltage wherein amplitude of the pulse signal is equivalent to the stress voltage;
applying the pulse signal to a testing device and measuring resistance value of the testing device based on voltage drop across the testing device and a predetermined current passing through the testing device;
detecting whether the testing device has melted or not based on the measured resistance value; and
determining a peak current of the testing device when the testing device has melted.

17. The peak current evaluation method as claimed in claim 16, further comprising:
measuring an AC current value of the pulse signal and a DC current value of a supply voltage; and
determining a duty ratio of the pulse signal by dividing the AC current value by the DC current value.

18. The peak current evaluation method as claimed in claim 17, further comprising:
measuring an average current value of the pulse signal with the stress voltage; and
determining the peak current of the testing device by dividing the average current value by the duty ratio.

19. The peak current evaluation method as claimed in claim 16, wherein the pulse width of the pulse signal is less than 100 ps (pico-seconds).

20. The peak current evaluation method as claimed in claim 16, wherein the predetermined parameter comprises information of pulse width, duty ratio, frequency, and duration of the pulse signal, and the predetermined parameter is obtained from IC design data.

* * * * *